United States Patent
Hira et al.

(10) Patent No.: US 10,320,355 B2
(45) Date of Patent: Jun. 11, 2019

(54) METHOD OF MANUFACTURING ELASTIC WAVE DEVICE

(71) Applicant: Murata Manufacturing Co., Ltd., Nagaokakyo-shi, Kyoto-fu (JP)

(72) Inventors: Mitsuyoshi Hira, Nagaokakyo (JP); Seiji Kai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 252 days.

(21) Appl. No.: 14/705,029

(22) Filed: May 6, 2015

(65) Prior Publication Data

US 2015/0236237 A1 Aug. 20, 2015

Related U.S. Application Data

(63) Continuation of application No. PCT/JP2013/078521, filed on Oct. 22, 2013.

(30) Foreign Application Priority Data

Dec. 5, 2012 (JP) ................................. 2012-266376

(51) Int. Cl.
*H03H 3/02* (2006.01)
*H01L 41/047* (2006.01)
(Continued)

(52) U.S. Cl.
CPC ............. *H03H 3/02* (2013.01); *H01L 41/047* (2013.01); *H01L 41/331* (2013.01);
(Continued)

(58) Field of Classification Search
CPC ............. H03H 3/02; H03H 2003/0478; H03H 9/1092; H03H 3/08; H01L 41/047;
(Continued)

(56) References Cited

U.S. PATENT DOCUMENTS

2002/0101304 A1 8/2002 Onishi et al.
2006/0192462 A1* 8/2006 Iwamoto ............. H03H 9/1092
310/348
(Continued)

FOREIGN PATENT DOCUMENTS

CN 101192816 A 6/2008
CN 101521493 A 9/2009
(Continued)

OTHER PUBLICATIONS

Machine Translation (English) of Japanese Patent Publication, JP 2012009991, Mar. 2018.*

(Continued)

*Primary Examiner* — A. Dexter Tugbang
(74) *Attorney, Agent, or Firm* — Keating & Bennett, LLP

(57) ABSTRACT

Functional element units and a connection line electrically connecting the functional element units are formed on one principal surface of a piezoelectric motherboard. A resin support layer enclosing the functional element units is formed on the one principal surface of the motherboard. An elastic wave device with the functional units is obtained by dividing a multilayer body including the motherboard, the functional element units, and the support layer into a plurality of sections along a dicing line. The connection line includes a line main body positioned on the dicing line, and a connection unit in which the line main body and the functional element units are electrically connected. Prior to dividing the multilayer body, a retaining member made of resin which straddles the line main body in the width direction of the line main body is formed separate from the support layer on the motherboard.

12 Claims, 8 Drawing Sheets

(51) Int. Cl.
    *H01L 41/338* (2013.01)
    *H01L 41/331* (2013.01)
    *H03H 3/08* (2006.01)
    *H03H 9/10* (2006.01)
    *H03H 3/04* (2006.01)
    *H01L 41/23* (2013.01)

(52) U.S. Cl.
    CPC ............ *H01L 41/338* (2013.01); *H03H 3/08* (2013.01); *H03H 9/1092* (2013.01); *H01L 41/23* (2013.01); *H03H 2003/0478* (2013.01); *Y10T 29/42* (2015.01); *Y10T 29/49005* (2015.01)

(58) Field of Classification Search
    CPC ..... H01L 41/23; H01L 41/331; H01L 41/338; Y10T 29/42; Y10T 29/49005
    See application file for complete search history.

(56) References Cited

U.S. PATENT DOCUMENTS

| | | |
|---|---|---|
| 2008/0122318 A1 | 5/2008 | Aikawa et al. |
| 2009/0212399 A1 | 8/2009 | Kaneda et al. |
| 2009/0315430 A1* | 12/2009 | Tsuda ................ H01L 41/311 310/313 B |
| 2010/0253182 A1 | 10/2010 | Takada et al. |
| 2011/0176264 A1 | 7/2011 | Tsuda |

FOREIGN PATENT DOCUMENTS

| | | | |
|---|---|---|---|
| JP | 02164118 A | * | 6/1990 |
| JP | 2002-261582 A | | 9/2002 |
| JP | 2006-333130 A | | 12/2006 |
| JP | 2008-135999 A | | 6/2008 |
| JP | 2012009991 A | * | 1/2012 |
| WO | 2009/078137 A1 | | 6/2009 |
| WO | 2010/047031 A1 | | 4/2010 |
| WO | 2012/132147 A1 | | 10/2012 |

OTHER PUBLICATIONS

Official Communication issued in corresponding Chinese Patent Application No. 201380060102.6, dated Oct. 8, 2016.
Official Communication issued in International Patent Application No. PCT/JP2013/078521, dated Jan. 28, 2014.

* cited by examiner

METHOD OF MANUFACTURING ELASTIC WAVE DEVICE

BACKGROUND OF THE INVENTION

1. Field of the Invention

The present invention relates to methods for manufacturing elastic wave devices, and elastic wave devices.

2. Description of the Related Art

As a method for manufacturing an elastic wave device, a method as follows has been widely known. That is, in this known method, a plurality of element units are formed on a motherboard which is made of a piezoelectric body, subsequently the motherboard and element units are divided into sections corresponding to each individual element unit, and thus a plurality of elastic wave devices are manufactured in the same manufacturing process. An example of such method is disclosed in International Publication No. WO2012/132147, for example.

In the manufacturing method disclosed in International Publication No. WO2012/132147, a plurality of element units are first formed on a motherboard which is made of a piezoelectric body. In the formation of the element units, a feed line connected to the element units is formed along with the element units. Next, a support layer having projection portions is formed on the motherboard so as to enclose the element units. Subsequently, a cover member is disposed on the support layer. Thereafter, by dividing a thus obtained multilayer body using a dicing tool into sections corresponding to each individual element unit, a plurality of elastic wave devices are manufactured in the same manufacturing process.

As disclosed in International Publication No. WO2012/132147, by providing projection portions on the support layer so as to suppress strain in the frame-like support layer caused by hardening shrinkage, leak defects in the sealing space can be suppressed.

However, with the method for manufacturing an elastic wave device disclosed in International Publication No. WO2012/132147, such a problem occurs in some case that the feed line is separated from the motherboard due to a cutting force of dicing, whereby the feed line cannot be removed. Because of the separation of the feed line electrically connected to the functional elements, there arises a problem that an elastic wave device having a short circuit defect is likely to be manufactured. Further, with the method for manufacturing an elastic wave device disclosed in International Publication No. WO2012/132147, in the case where the number of the projection portions is increased in order to prevent the separation of the feed line, there arises a problem that leak defects are likely to be generated because the projection portions deformed due to the cutting force of dicing consequently deform a support member main body.

SUMMARY OF THE INVENTION

Preferred embodiments of the present invention provide a method for manufacturing an elastic wave device that significantly reduces, minimizes or prevents generation of short circuit defects and leak defects.

In a method for manufacturing an elastic wave device according to a preferred embodiment of the present invention, a plurality of functional element units and a connection line that electrically connects the plurality of functional element units are formed on one principal surface of a motherboard having piezoelectricity. A support layer made of resin configured to enclose the functional element units is formed on the one principal surface of the motherboard. An elastic wave device including the functional element unit is obtained by dividing a multilayer body including the motherboard, the functional element units, and the support layer into a plurality of sections along a dicing line. The connection line includes a line main body positioned on the dicing line, and a connection unit in which the line main body and the functional element units are electrically connected. Prior to dividing the multilayer body, a retaining member made of resin which straddles the line main body in the width direction of the line main body is formed separate from the support layer on the motherboard.

In a specific aspect of a method for manufacturing an elastic wave device according to various preferred embodiments of the present invention, there is provided the retaining member configured to cover an end portion of the connection unit on a line main body side.

In another specific aspect of a method for manufacturing an elastic wave device according to various preferred embodiments of the present invention, the retaining member is configured so that an area where the retaining member is not provided is larger than an area where the retaining member is provided in a region in which the dicing line is positioned.

In still another aspect of a method for manufacturing an elastic wave device according to various preferred embodiments of the present invention, the retaining member and the support layer are formed in the same technical process or manufacturing step.

An elastic wave device according to another preferred embodiment of the present invention includes a piezoelectric substrate, a functional element unit, an electrode unit, a support layer, and a cover. The functional element unit is provided on one principal surface of the piezoelectric substrate. The electrode unit is electrically connected to the functional element unit. The electrode unit extends to an end side of the piezoelectric substrate. The support layer is provided on the one principal surface of the piezoelectric substrate so as to enclose the functional element unit. The cover is supported by the support layer. The cover covers the functional element unit. The support layer is provided separate from the end side of the piezoelectric substrate and encloses the functional element unit. The elastic wave device according to a preferred embodiment of the present invention further includes a retaining member made of resin. The retaining member is provided separate from the support layer on the piezoelectric substrate. The retaining member extends to the end side of the piezoelectric substrate.

According to various preferred embodiments of the present invention, it is possible to provide a method for manufacturing an elastic wave device capable of significantly reducing, minimizing or preventing the generation of short circuit defects and leak defects.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
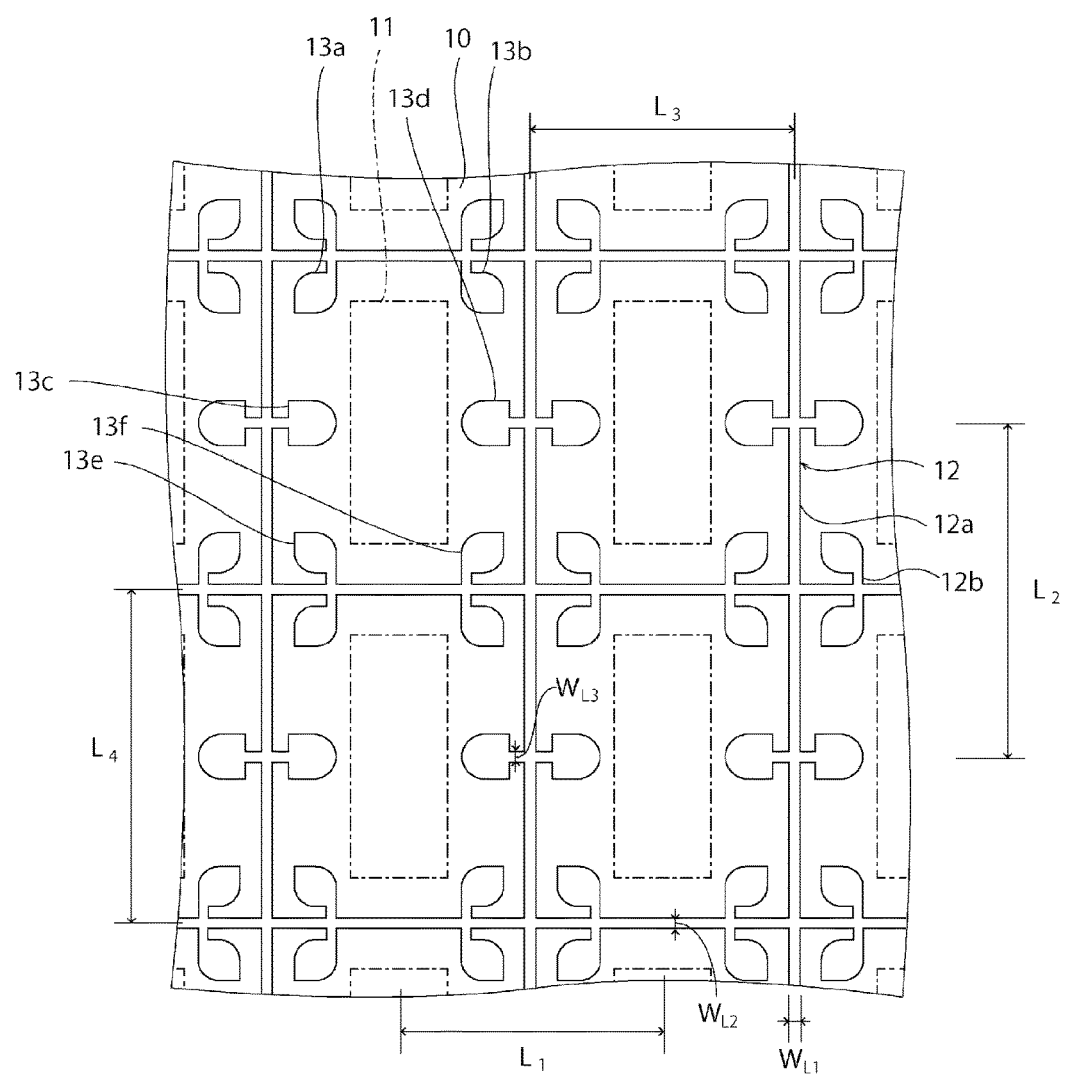
FIG. 1 is a schematic plan view for explaining a manufacturing process of an elastic wave device according to a first preferred embodiment of the present invention.

Hereinafter, examples of preferred embodiments of the present invention will be described. It is to be noted that the following preferred embodiments are merely examples. The present invention is not intended to be limited to the following preferred embodiments in any way.

In the drawings referred to in the preferred embodiments and the like, members having functions that are the same or substantially the same will be referred to as the same reference numerals. Further, the drawings referred to in the description of preferred embodiments and the like are schematically depicted. As such, the ratios of dimensions and so on of objects depicted in the drawings may differ from the actual ratios of dimensions and so on of those objects. The ratios of dimensions and so on of the objects may differ from drawing to drawing as well. The specific ratios of dimensions and so on of objects should be understood in consideration of the following descriptions.

First Preferred Embodiment

Figure 7:
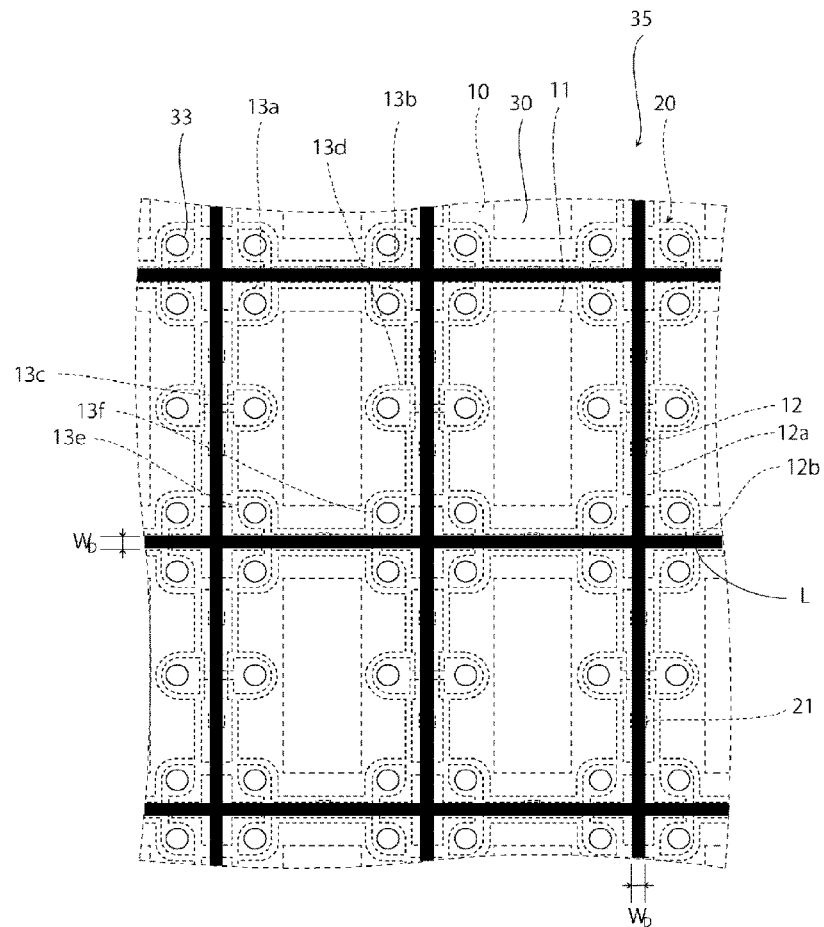
FIG. 7 is a schematic plan view illustrating a multilayer body manufactured in the first preferred embodiment of the present invention.
Figure 8:
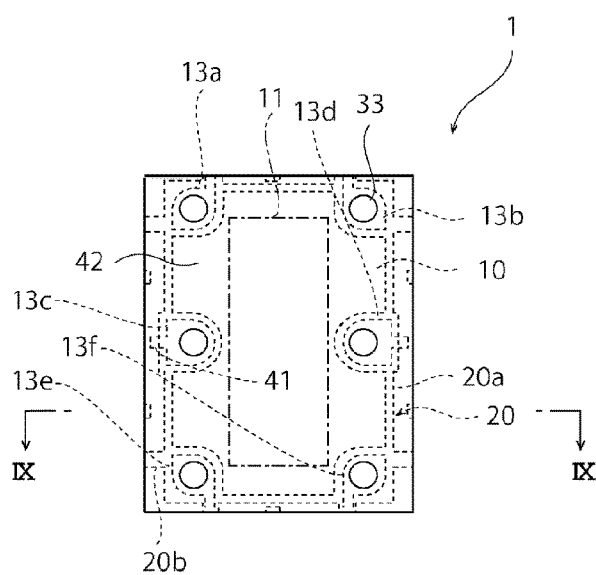
FIG. 8 is a schematic plan view illustrating an elastic wave device manufactured in the first preferred embodiment of the present invention.

In a first preferred embodiment of the present invention, a method for manufacturing an elastic wave device 1 illustrated in FIGS. 8 and 9 will be described referring mainly to FIGS. 1 through 7. In the present preferred embodiment, the elastic wave device 1 preferably is a surface acoustic wave device, however, it may be another type of elastic wave device such as a boundary acoustic wave device or the like, for example.

First, as shown in FIG. 1, a plurality of functional element units 11 and a connection line 12 are formed on a motherboard 10. The mother board 10 is made of, for example, a piezoelectric body. The motherboard 10 has piezoelectricity. The motherboard 10 may be configured with a piezoelectric substrate. Further, the motherboard 10 may include a piezoelectric substrate and a non-piezoelectric layer arranged on one principal surface of the piezoelectric substrate. The piezoelectric substrate can be configured with, for example, $LiTaO_3$, $LiNbO_3$, crystal, or the like. The non-piezoelectric layer can be configured with silicon oxide or the like, for example. A thickness ($H_1$) of the motherboard 10 can be set to about 100 μm to about 300 μm, for example.

The functional element unit 11 and the connection line can be formed by, for example, a sputtering method, a chemical vapor deposition (CVD) method, or the like.

As shown in FIG. 1, the plurality of functional element units 11 are formed in matrix form on the motherboard 10. It is preferable for a row interval $L_1$ between the plurality of functional element units 11 to be about 500 μm to about 1,800 μm, for example. It is preferable for a column interval $L_2$ between the plurality of functional element units 11 to be about 500 μm to about 1,800 μm, for example.

The plurality of functional element units 11 each include at least one interdigital transducer (IDT) electrode and excite elastic waves. For example, in the case where the elastic wave device 1 is an elastic wave filter device, the functional element unit 11 may configure at least one of a ladder-type filter unit and a longitudinally coupled resonator-type elastic wave filter unit.

The functional element unit 11 includes a plurality of electrode lands 13a through 13f to which at least one IDT electrode is electrically connected. The plurality of electrode lands 13a through 13f are each electrically connected to the connection line 12.

Figure 4:
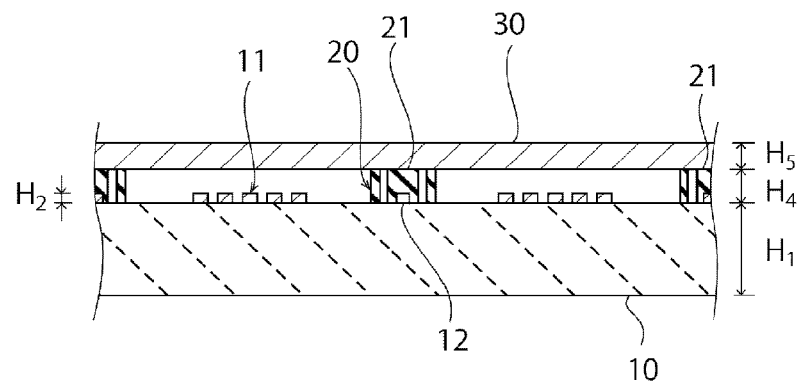
FIG. 4 is a schematic cross-sectional view taken along a IV-IV line in FIG. 3.

As shown in FIG. 1 and FIG. 4, the connection line 12 includes a line main body 12a and a connection unit 12b. It is preferable for a column interval $L_3$ of the line main body 12a to be about 500 μm to about 1,800 μm, for example. It is preferable for a row interval $L_4$ of the line main body 12a to be about 500 μm to about 1,800 μm, for example. It is preferable for a thickness $H_2$ of the line main body 12a to be about 0.5 μm to about 5 μm, for example. The connection unit 12b electrically connects the line main body 12a to the functional element unit 11 (specifically, the electrode lands 13a through 13f of the functional element unit 11). To be more specific, the electrode lands 13a through 13f are each electrically connected to the line main body 12a via the connection unit 12b. It is preferable for line widths $W_{L1}$, $W_{L2}$ of the line main body 12a and a line width $W_{L3}$ of the connection unit 12b to be about 5 μm to about 30 μm, for example.

Figure 2:
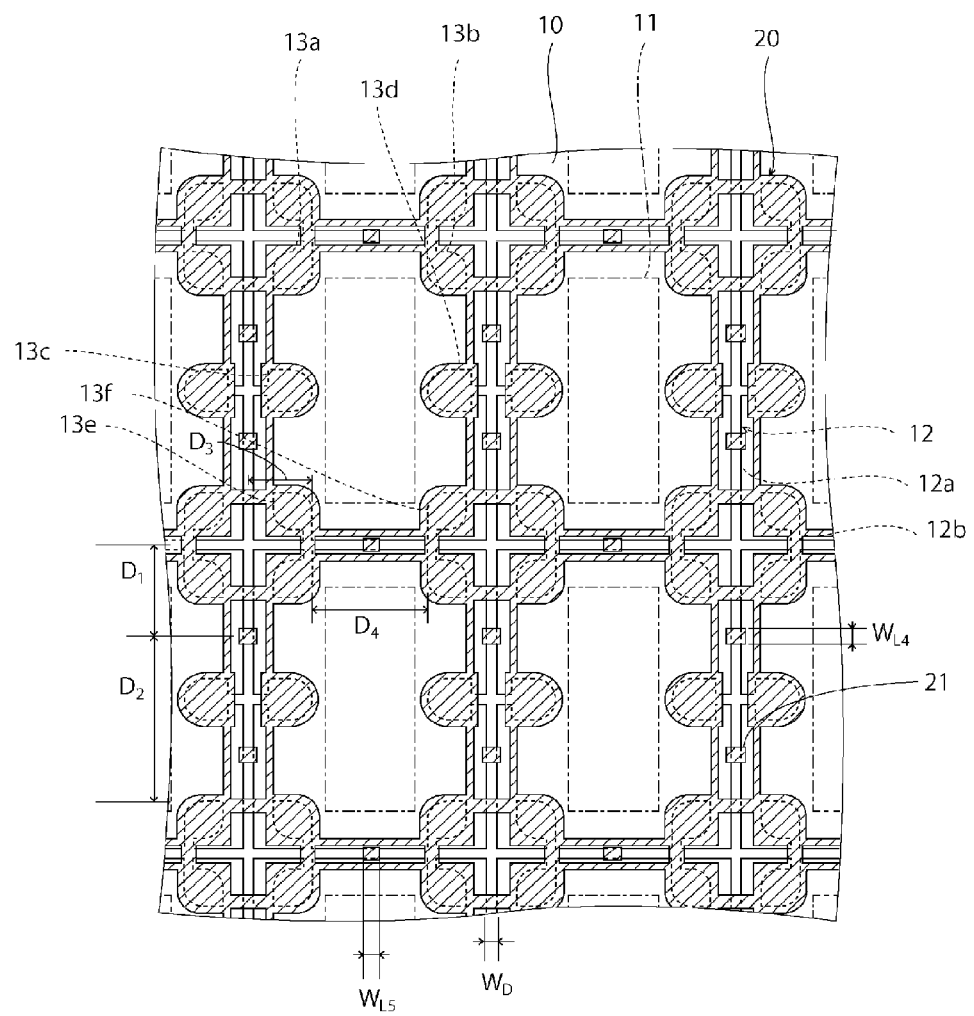
FIG. 2 is a schematic plan view for explaining a manufacturing process of an elastic wave device according to the first preferred embodiment of the present invention.

Next, as shown in FIG. 2, a support layer 20 made of resin is formed on the motherboard 10 so as to enclose each of the plurality of functional element units 11. It is preferable for a thickness $H_3$ of the support layer 20 to be about 5 μm to about 20 μm, for example. The support layer 20 can be formed through patterning a resin layer, having been formed on the overall motherboard 10 by screen printing or the like, using a photolithographic method or the like, for example. The support layer 20 can be configured with, for example, a polyimide resin, an epoxy resin, a silicone resin, or the like.

A retaining member 21 is so formed as to intersect with the line main body 12a. The retaining member 21 is formed on the motherboard 10 so as to straddle the line main body 12a in the width direction of the line main body 12a. It is preferable for a thickness $H_4$ of the retaining member 21 to be about 5 μm to about 20 μm, for example. Note that the thickness $H_4$ of the retaining member 21 may be smaller than the thickness $H_3$ of the support layer 20 and the member may not be connected to the cover. It is preferable for widths $W_{L4}$ and $W_{L5}$ of the retaining member 21 to be about 10 μm to about 80 μm, for example. It is preferable for an interval $D_2$ of the retaining member 21 to be about 300 µm to about 1,700 µm, for example. As such, the retaining member 21 includes an intersecting portion 21a that is not connected to the support layer 20 and intersects with the line main body 12a. A plurality of intersecting portions 21a are provided with intervals therebetween along a direction in which the line main body 12a extends. A direction in which the intersecting portion 21a extends and the direction in which the line main body 12a extends may be slanted or inclined relative to each other; however, typically speaking, the direction in which the intersecting portion 21a extends and the direction in which the line main body 12a extends are preferably perpendicular or substantially perpendicular to each other. Only the intersecting portion 21a of the retaining member 21 is provided on the line main body 12a, whereas a portion of the retaining member 21 other than the intersecting portion 21 is not provided on the line main body 12a. In other words, a portion of the line main body 12a other than the portion covered by the intersecting portion 21a is exposed from the retaining member 21. The support layer 20 is not provided on the line main body 12a, and covers the electrode lands 13a through 13f. Note that in the first preferred embodiment, an example in which the retaining member 21 and the support member 20 use the same material and are formed simultaneously through patterning using a photolithographic method, for example, is described. In other words, an example in which the retaining member 21 and the support member 20 are integrally formed is described. It is to be noted that, however, the retaining member 21 and the support layer 20 may be formed using different materials through different forming methods, respectively.

Figure 3:
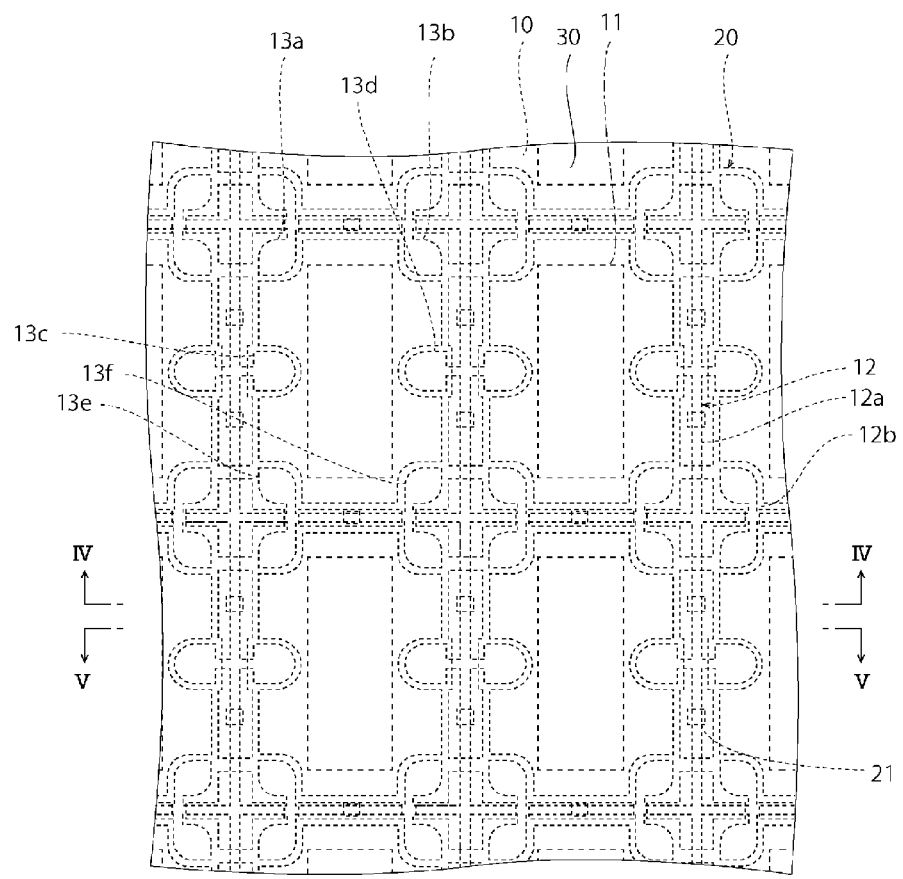
FIG. 3 is a schematic plan view for explaining a manufacturing process of an elastic wave device according to the first preferred embodiment of the present invention.
Figure 5:
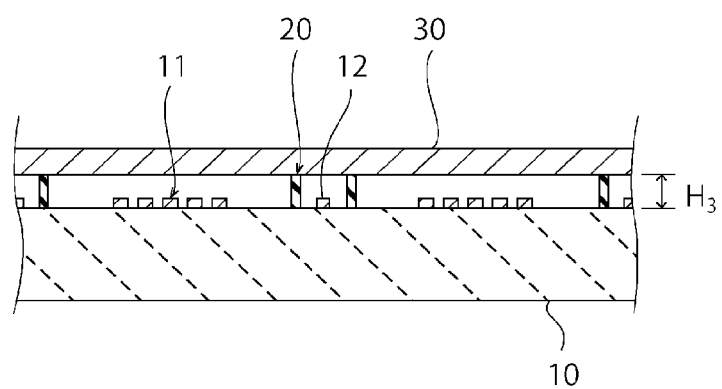
FIG. 5 is a schematic cross-sectional view taken along a V-V line in FIG. 3.

Next, as shown in FIGS. 3 through 5, by providing a plate-shaped cover 30 on the support layer 20 so as to cover the plurality of functional element units 11, the functional element units 11 are sealed in a space configured by the motherboard 10, the support layer 20, and the cover 30. It is preferable for a thickness $H_5$ of the cover 30 to be about 10 µm to about 60 µm, for example. The cover 30 can be configured with a material such as resin, glass, ceramics, or the like, for example. The surface shape of the plate-shaped cover includes not only a planar surface but also a curved surface. The cover 30 is not limited to a configuration in which the cover 30 is formed with a single material; the cover 30 may be a multilayer body formed of a plurality of layers made of different materials.

Figure 6:
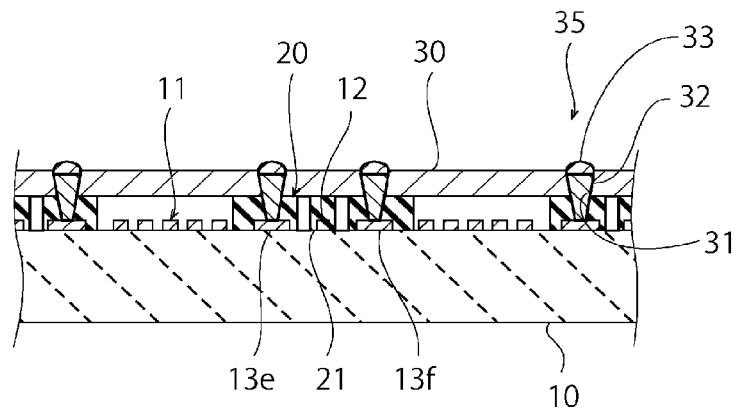
FIG. 6 is a schematic cross-sectional view illustrating a multilayer body manufactured in the first preferred embodiment of the present invention.

Next, as shown in FIG. 6, via holes 31 configured to extend to the electrode lands 13a through 13f are formed in the support layer 20 and the cover 30. Thereafter, a plurality of under-bump metals 32 and bump electrodes 33 are sequentially formed on the exposed portions of the electrode lands 13a through 13f, respectively, such that a multilayer body 35 as shown in FIGS. 6 and 7 is completed. The plurality of under-bump metals 32 can be formed simultaneously by plating while the electrode lands 13a through 13f being supplied with electricity via the connection line 12, for example. As such, the connection line 12 is called a feed line in some case in the present invention.

Subsequently, the multilayer body 35 is divided into a plurality of sections by dicing along a dicing line L whose column interval $L_3$ and row interval $L_4$ are so set as to form a lattice pattern same as the line main body 12a, as shown in FIG. 7. As a result, the elastic wave device 1 shown in FIGS. 8 and 9 is completed. It is preferable for a width $W_D$ of the dicing line L to be about 10 µm to about 50 µm, for example.

Figure 9:
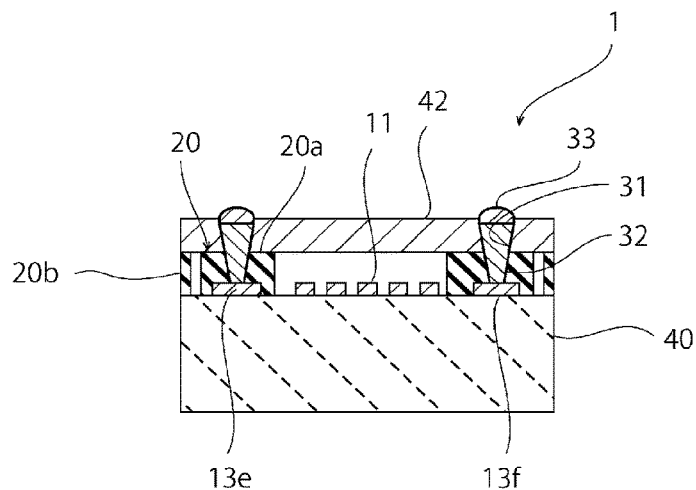
FIG. 9 is a schematic cross-sectional view taken along a IX-IX line in FIG. 8.

The elastic wave device 1 includes a piezoelectric substrate 40 formed of the motherboard 10 (see FIG. 9). The functional element unit 11 is provided on the piezoelectric substrate 40. The functional element unit 11 includes at least one IDT electrode and the plurality of electrode lands 13a through 13f to which at least the one IDT electrode is electrically connected. An electrode unit 41 (see FIG. 8) configured with the connection unit 12b of the connection line 12 is electrically connected to the electrode lands 13a through 13f, respectively. The electrode unit 41 extends to an end side of the piezoelectric substrate 40. The support layer 20 configured to enclose the functional element unit 11 is provided on the piezoelectric substrate 40. A cover 42 supported by the support layer 20 is provided on the piezoelectric substrate 40. The cover 42 is defined by the cover 30.

In the present preferred embodiment, the dicing line L is set so that the line main body 12a is positioned on the dicing line L. The width $W_D$ with which the motherboard 10 is cut by a dicing saw is larger than the widths $W_{L1}$ and $W_{L2}$ of the line main body 12a. As such, the line main body 12a is removed by the dicing and the electrode lands 13a through 13f are electrically insulated from each other.

Incidentally, the dicing saw is likely to be clogged if a material made of resin is present on the dicing line. In view of this, it is preferable not to arrange a support layer made of resin on the dicing line.

However, the inventors of preferred embodiments of the present invention have discovered through extensive research that leak defects are likely to be generated, in the case where a projection portion connected to the support layer is provided on the dicing line, due to deformation of the support layer of the elastic wave device to be manufactured. The inventors have also discovered that short circuit defects are easily caused by separation of the connection line during the dicing.

As such, in various preferred embodiments of the present invention, as shown in FIG. 2, the retaining member 21 preferably is formed and configured to intersect with the line main body 12a of the connection line 12 and not connected to the support layer (typically speaking, formed or configured to be perpendicular or substantially perpendicular to the line main body 12a). Further, it is preferable for an area where the retaining member 21 is not disposed to be larger than an area where the retaining member 21 is disposed on the dicing line L. Explanation about this will be specifically given based on the present preferred embodiment. That is, size of the intersecting portions in a dicing region, which is a product of the number of intersecting portions therein and an area calculated by $W_D \times W_{L4}$, is taken as an area value $A_1$. Meanwhile, size of the dicing region calculated by $W_D \times L_4$ is taken as an area value $A_2$. In this case, in order to make an area of the intersecting portions removed by the dicing larger than an area of a region exposed on the piezoelectric substrate by the dicing, it is preferable for the area value $A_1$ of the intersecting portions to be equal to or less than half the area value $A_2$ of the dicing region. As such, it is preferable for a ratio of $A_2/A_1$ to be equal to or more than 2. Specifically, in a non-limiting working example of $D_2$: 500 µm, $W_D$: 10 µm, $W_{L4}$: 80 µm, $L_4$: 1,000 µm, and the number of intersecting portions: 2, a calculation result of $A_2/A_1=3.12$ is obtained. Likewise, size of the intersecting portions in a dicing region, which is a product of the number of intersecting portions therein and an area calculated by $W_D \times W_{L3}$, is taken as an area value $A_3$. Size of the dicing region calculated by $W_D \times L_3$ is taken as an area value $A_4$. In a working example of D4: 300 µm, $W_D$: 10 µm, $W_{L5}$: 50 µm, $L_3$: 500 µm, and the number of intersecting portions: 2, a calculation result of $A_4/A_3=6.25$ is obtained. It is preferable for $A_2/A_1$ and $A_4/A_3$ to be greater than 3. Further, in order to significantly reduce, minimize or prevent generation of separation of the line main body 12a, it is preferable to dispose a plurality of retaining members 21 at predetermined intervals in a direction in which the line main body 12a extends so as to support the line main body 12a at a plurality of supporting portions. However, as the number of portions at which the retaining members 21 are disposed is increased, clogging in the dicing saw increases. Here, in the method for manufacturing an elastic wave device disclosed in International Publication No. WO2012/132147, in the case where the widths $W_{L4}$ and $W_{L5}$ of the retaining member 21 are made narrower in the formation thereof than the width of the support layer 20, the retaining member 21 becomes likely to be deformed by the cutting force of dicing. As a result, the support layer is deformed by the retaining member 21 connected to the support layer 20 so that an elastic wave device having leak defects might be manufactured.

However, by forming the retaining member 21 which is not connected to the support layer 20 and carrying out dicing, leak defects caused by the deformation of the retaining member are significantly reduced, minimized or prevented. In addition, the separation of the connection line 12 during the dicing is significantly reduced, minimized or prevented, and the clogging in the dicing saw is significantly reduced, minimized or prevented as well. As a result, generation of an elastic wave device having leak defects and short circuit defects is significantly reduced, minimized or prevented. This makes it possible to manufacture elastic wave devices at a high non-defective product ratio. Further, the retaining member 21 smaller in width than the support layer 20 can be formed, such that a time interval at which a dressing process for removing the clogging in the dicing saw is carried out is lengthened because the dicing saw is prevented from being clogged. Alternatively, an effect that a time interval for exchanging a dicing saw is lengthened and an effect that the generation of short circuit defects is significantly reduced, minimized or prevented is obtained at the same time. To be more specific, in the case where the working examples in the first preferred embodiment and a first comparison example in which the retaining member 21 was not provided in the first preferred embodiment were compared with regard to a ratio of generation of short circuit defects using 12,000 samples, the number of generated short circuit defects in the working examples of the first preferred embodiment was 0, which is 0 ppm, while in the first comparison example, the number of generated short circuit defects was 8, which is 667 ppm. Further, in the case where the comparison with regard to a ratio of generation of leak defects in both the examples was carried out, several leak defects were generated in the ten thousand samples in the first comparison example, that is, generated at a ratio of 100 ppm to 900 ppm, while in the first preferred embodiment, the number of leak defects was 0 in the ten thousand samples. Moreover, in the case where the first preferred embodiment and a second comparison example in which the whole dicing line was covered by the support layer 20 in the first preferred embodiment were compared with regard to a time interval at which the dressing process for a dicing saw was carried out, the dressing process for the dicing saw was needed to be carried out every five dicing lines in the first preferred embodiment, while in the second comparison example, the dressing process was needed to be carried out every single dicing line. Note that cutting a motherboard with a clogged dicing saw may cause a problem that the motherboard is broken, cracked, or the like.

The support layer 20 is not positioned on the dicing line L aside from the intersecting portion 21a. With this, clogging is unlikely to be generated in a dicing saw that is used for dicing the multilayer body 35 in comparison with a case in which a resin layer is provided on the overall dicing line L, or the like, for example.

As discussed thus far, the retaining member 21 being formed so as to intersect with the line main body 12a of the connection line 12 in the present preferred embodiment, the support layer 20 is disposed separate from an end side of the piezoelectric substrate 40, and there are provided the support layer main body 20 that encloses the functional element unit 11 and the retaining member 21 that is not connected to the support layer 20 and extends to the end side of the piezoelectric substrate 40 in the elastic wave device 1.

In order to more effectively significantly reduce, minimize or prevent the separation of the connection line 12, it is preferable for the plurality of intersecting portions 21a to be provided at set intervals on each side of each region of the multilayer body 35 configuring the elastic wave device 1.

Figure 10:
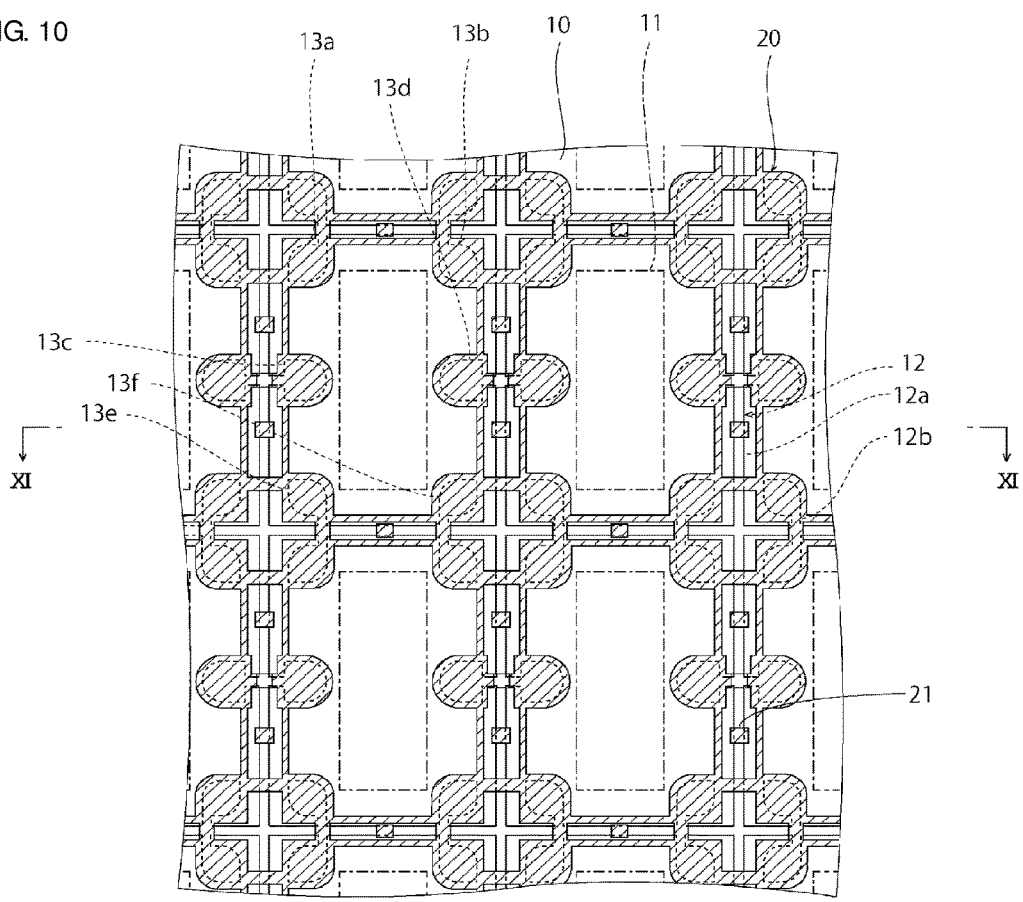
FIG. 10 is a schematic plan view for explaining a manufacturing process of an elastic wave device according to a second preferred embodiment of the present invention.
Figure 11:
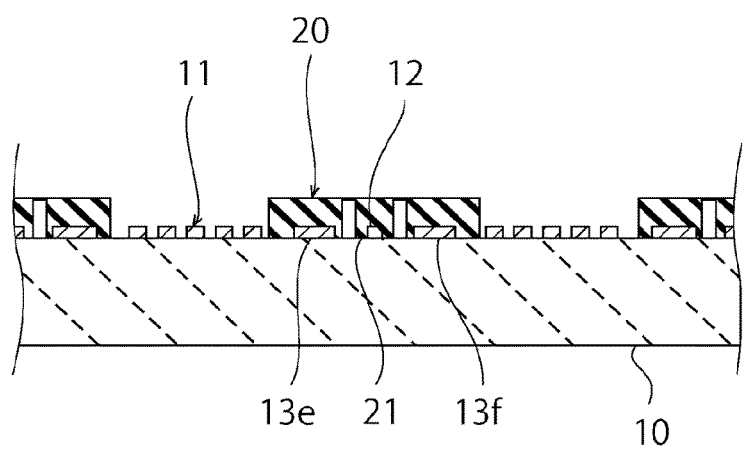
FIG. 11 is a schematic cross-sectional view taken along a XI-XI line in FIG. 10.
Figure 12:
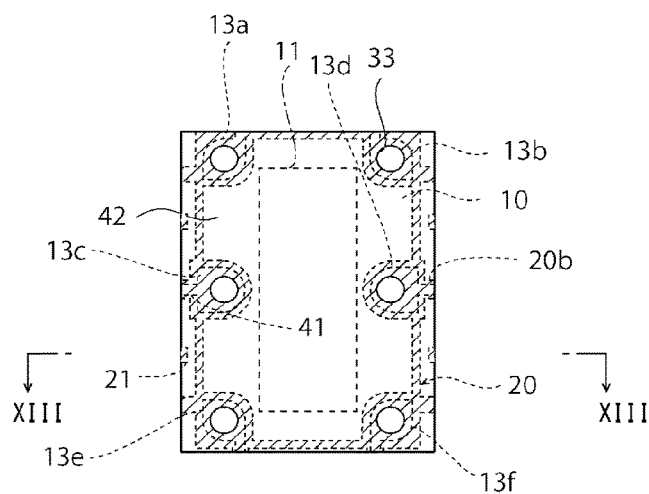
FIG. 12 is a schematic plan view illustrating an elastic wave device manufactured in the second preferred embodiment of the present invention.
Figure 13:
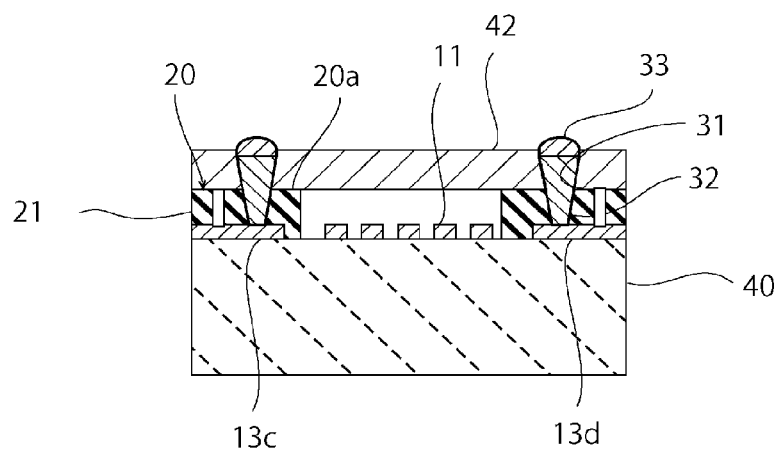
FIG. 13 is a schematic cross-sectional view taken along a XIII-XIII line in FIG. 12.
Figure 14:
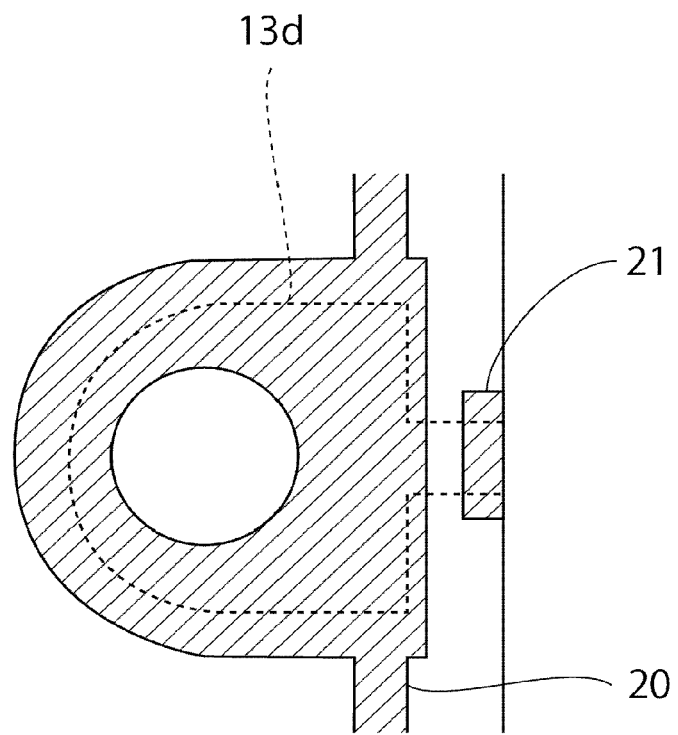
FIG. 14 is a schematic plan view in which an area in the vicinity of an electrode land in FIG. 12 is enlarged and illustrated.

Further, as shown in FIGS. 10 and 11, it is preferable to provide the support layer 20 so that the intersecting portion 21a covers an end portion of the connection unit 12b on a line main body 12a side. Furthermore, as shown in FIG. 14, the retaining member 21 is not connected to the support layer 20 and covers a portion of the electrode unit 41, and another portion of the electrode unit 41 may be exposed from the retaining member 21.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing an elastic wave device comprising:
   a step of forming a plurality of functional element units and a connection line that electrically connects the plurality of functional element units on one principal surface of a motherboard having piezoelectricity;
   a step of forming a support layer made of resin that encloses the functional element units on the one principal surface of the motherboard; and
   a step of obtaining an elastic wave device having the functional element units by a step of dividing a multilayer body including the motherboard, the functional element units, and the support layer into a plurality of sections along a dicing line; wherein
   the connection line includes a line main body positioned on the dicing line, and a connection unit in which the line main body and the functional element units are electrically connected;
   the line main body and the connection unit are both formed in the step of forming the plurality of functional element units and the connection line;
   the step of dividing the multilayer body includes a step of dicing the multilayer body along the dicing line such that electrical connection between the connection unit and the line main body is broken;
   the connection unit is electrically connected to the line main body and the functional element units before the step of dicing the multilayer body; and
   the method further including a step of forming a retaining member made of resin which straddles the line main body in a width direction of the line main body and is separate from the support layer on the motherboard prior to dividing the multilayer body.

2. The method for manufacturing an elastic wave device according to claim 1, wherein the retaining member is formed to cover an end portion of the connection unit on a line main body side.

3. The method for manufacturing an elastic wave device according to claim 1, wherein the retaining member is formed so that an area where the retaining member is not provided is larger than an area where the retaining member is provided in a region in which the dicing line is positioned.

4. The method for manufacturing an elastic wave device according to claim 1, wherein the retaining member and the support layer are formed in a same step or a same technical process.

5. The method for manufacturing an elastic wave device according to claim 1, wherein the elastic wave device is one of a surface acoustic wave device and a boundary wave device.

6. The method for manufacturing an elastic wave device according to claim 1, wherein the plurality of functional element units are formed in a matrix configuration on the motherboard.

7. The method for manufacturing an elastic wave device according to claim 1, wherein the retaining member includes an intersecting portion that is not connected to the support layer and intersects with the line main body.

8. The method for manufacturing an elastic wave device according to claim 7, wherein only the intersecting portion of the retaining member is formed on the line main body and a portion of the retaining member other than the intersecting portion is not provided on the line main body.

9. The method for manufacturing an elastic wave device according to claim 1, further comprising a step of providing a cover to be supported by the support layer and to cover the functional element units.

10. The method for manufacturing an elastic wave device according to claim 9, further comprising the step of forming via holes in the cover and the support layer.

11. The method for manufacturing an elastic wave device according to claim 1, wherein an area where the retaining member is not disposed is larger than an area where the retaining member is disposed on the dicing line.

12. The method for manufacturing an elastic wave device according to claim 1, wherein the retaining member includes a plurality of intersecting portions not connected to the support layer and intersecting with the line main body, the plurality of intersecting portions being arranged at set intervals on a side of each region of the multilayer body.

* * * * *